US009380235B2

(12) United States Patent
Sato

(10) Patent No.: US 9,380,235 B2
(45) Date of Patent: Jun. 28, 2016

(54) AD CONVERSION CIRCUIT

(71) Applicant: Kabushiki Kaisha Toshiba, Minato-ku (JP)

(72) Inventor: Maki Sato, Yamato (JP)

(73) Assignee: Kabushiki Kaisha Toshiba, Minato-ku (JP)

(*) Notice: Subject to any disclaimer, the term of this patent is extended or adjusted under 35 U.S.C. 154(b) by 0 days.

(21) Appl. No.: 14/464,120

(22) Filed: Aug. 20, 2014

(65) Prior Publication Data

US 2015/0263751 A1 Sep. 17, 2015

(30) Foreign Application Priority Data

Mar. 14, 2014 (JP) ................. 2014-052705

(51) Int. Cl.
H03M 1/06 (2006.01)
H04N 5/369 (2011.01)
H03M 1/00 (2006.01)
H03M 1/46 (2006.01)

(52) U.S. Cl.
CPC ................. *H04N 5/369* (2013.01); *H03M 1/00* (2013.01); *H03M 1/466* (2013.01)

(58) Field of Classification Search
CPC ............................. H03M 1/182; H03M 1/462
USPC .................................................. 341/161–163
See application file for complete search history.

(56) References Cited

U.S. PATENT DOCUMENTS

| 7,973,695 | B2 | 7/2011 | Kudo |
| 8,022,856 | B2 | 9/2011 | Sakakibara |
| 8,093,543 | B2 | 1/2012 | Yamaoka et al. |
| 8,344,927 | B2 * | 1/2013 | Jeon .................... H03M 1/1019 327/307 |
| 8,355,068 | B2 | 1/2013 | Kondo |
| 8,456,347 | B2 * | 6/2013 | Wikner ............... H03M 1/1023 341/118 |
| 8,766,833 | B1 * | 7/2014 | Bogner ............... H03M 1/1014 341/118 |
| 2011/0240832 | A1 | 10/2011 | Kawahito et al. |
| 2012/0194718 | A1 | 8/2012 | Sato et al. |

FOREIGN PATENT DOCUMENTS

| JP | 2001-339303 A | 12/2001 |
| JP | 2010-63055 | 3/2010 |
| JP | 2010-259051 | 11/2010 |
| JP | 2011-35689 | 2/2011 |
| JP | 2011-41205 | 2/2011 |
| JP | 2012-160948 | 8/2012 |
| JP | 5187782 | 4/2013 |
| JP | 2013-90233 | 5/2013 |
| KR | 10-0660958 B1 | 12/2006 |
| WO | WO 2009/131018 A1 | 10/2009 |
| WO | WO 2010/044444 A1 | 4/2010 |
| WO | WO 2011/096340 A1 | 8/2011 |
| WO | WO 2013/058213 A1 | 4/2013 |

OTHER PUBLICATIONS

Office Action issued on Nov. 17, 2015 in Korean Patent Application No. 10-2014-0108768 with English translation.

* cited by examiner

*Primary Examiner* — Khai M Nguyen

(74) *Attorney, Agent, or Firm* — Oblon, McClelland, Maier & Neustadt, L.L.P

(57) ABSTRACT

According to one embodiment, an AD conversion circuit of a pipeline type or successive-approximation type which compares an input voltage and a reference voltage to perform AD conversion is provided which comprises a reference voltage generating unit that generates the reference voltage. The reference voltage generating unit changes the reference voltage according to an analog-gain specifying value for setting a gain of an output value against the input voltage.

17 Claims, 17 Drawing Sheets

FIG.2

| COMP1 | COMP2 | DAC INPUT | DAC OUTPUT |
|---|---|---|---|
| 1 | 0 | 1 | Vref/2 |
| 0 | 1 | 0 | 0 |
| 0 | 0 | -1 | -Vref/2 |

FIG.10

| ANALOG GAIN | Vref | Vref/2 (Vfs=5.0V) | Vsig | | | | |
|---|---|---|---|---|---|---|---|
| | | | 2.8 | 1.2 | 0.7 | 0.4 | |
| 1.0 | Vfs=5.0V | 2.5V | 286 | 122 | 71 | 40 | |
| 1.79 | Vfs×(1/1.79)=2.8V | 1.4V | 511 | 219 | 128 | 73 | |
| 4.17 | Vfs×(1/4.17)=1.2V | 0.6V | - | 511 | 290 | 84 | |
| 7.14 | Vfs×(1/7.14)=0.7V | 0.35V | - | - | 511 | 292 | |
| 12.5 | Vfs×(1/12.5)=0.4V | 0.2 | - | - | - | 511 | |

FIG.18

| ANALOG GAIN | Vref | Vref (Vfs=5.0V) | Vsig | | | | |
|---|---|---|---|---|---|---|---|
| | | | 2.8 | 1.2 | 0.7 | 0.4 |
| 1.0 | Vfs/2=2.5V | 2.5V | 286 | 122 | 71 | 40 |
| 1.79 | Vfs/2×(1/1.79)=1.4V | 1.4V | 511 | 219 | 128 | 73 |
| 4.17 | Vfs/2×(1/4.17)=0.6V | 0.6V | - | 511 | 290 | 84 |
| 7.14 | Vfs/2×(1/7.14)=0.35V | 0.35V | - | - | 511 | 292 |
| 12.5 | Vfs/2×(1/12.5)=0.2V | 0.2 | - | - | - | 511 |

AD CONVERSION CIRCUIT

CROSS-REFERENCE TO RELATED APPLICATIONS

This application is based upon and claims the benefit of priority from Japanese Patent Application No. 2014-052705, filed on Mar. 14, 2014; the entire contents of which are incorporated herein by reference.

FIELD

Embodiments described herein relate generally to an AD conversion circuit.

BACKGROUND

In solid-state imaging devices, a single-slope type, pipeline type, or successive-approximation type of AD conversion circuit is provided for each column of a plurality of pixels arranged in rows and columns, and the AD conversion circuit AD-converts an analog signal from each pixel of the column to produce a digital signal. The pipeline type or successive-approximation type of AD conversion circuit of these AD conversion circuits compares a reference voltage and the analog signal of the pixel, thereby converting the analog signal of the pixel into a digital value. A configuration is disclosed where a programmable gain amplifier (PGA) circuit for amplifying the analog signal from the pixel cell is provided in order to adjust the brightness of video outputted from the solid-state imaging device in the above-mentioned conversion, but with this configuration, an equal number of PGA circuits to the number of vertical pixel columns are necessary. For the purpose of reducing the cost of realizing the solid-state imaging device, it is desired to enable gain adjustment without providing PGA circuits.

BRIEF DESCRIPTION OF THE DRAWINGS

FIG. 2 is a figure showing the relation between the output of an analog operation unit and the input and output of a DAC;

FIG. 10 is a figure showing the relation between the analog gain and the reference voltage, and the output values against Vsig in the AD conversion circuit according to the first embodiment;

FIG. 18 is a figure showing the relation between the analog gain and the reference voltage, and the output values against Vsig in the AD conversion circuit according to the second embodiment.

DETAILED DESCRIPTION

According to embodiments, an AD conversion circuit of a pipeline type or successive-approximation type which compares an input voltage and a reference voltage to perform AD conversion is provided which comprises a reference voltage generating unit that generates the reference voltage. The reference voltage generating unit changes the reference voltage according to an analog-gain specifying value for setting a gain of an output value against the input voltage.

The AD conversion circuits according to embodiments will be described in detail below with reference to the accompanying drawings. The present invention is not limited to these embodiments.

First Embodiment

Figure 1:
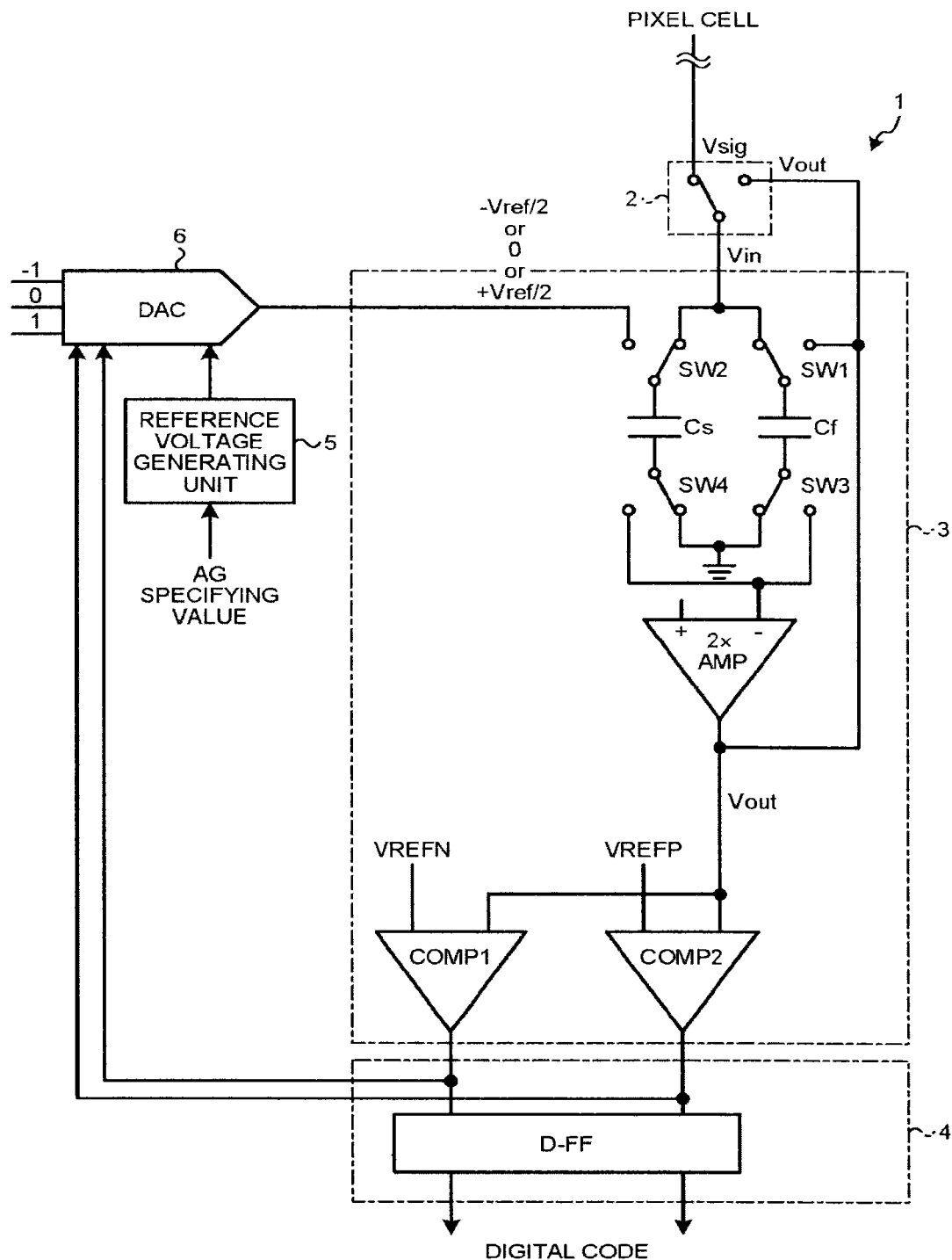
FIG. 1 is a diagram showing the configuration of a 1.5-bit redundancy pipeline AD conversion circuit according to a first embodiment.

FIG. 1 is a diagram showing the configuration of a 1.5-bit redundancy pipeline AD conversion circuit according to the first embodiment. The example shown in FIG. 1 is an example where the invention is applied to a circular-type pipeline AD conversion circuit. Where the AD conversion circuit 1 according to the first embodiment is applied to a CMOS sensor, a correlated double sampling (CDS) scheme may be adopted. In this case, an S/H (Sample and Hold) circuit is provided at the front stage of the AD conversion circuit, but herein the S/H circuit is omitted from the figure.

The pipeline AD conversion circuit 1 according to the first embodiment comprises an input switching unit 2, an analog operation unit 3, a digital processing unit 4, a reference voltage generating unit 5, and a DAC 6.

In the circular-type pipeline AD conversion circuit, the input switching unit 2 switches between a voltage Vsig from a pixel cell and Vout from the analog operation unit 3 so that one of the two becomes the input voltage Vin of the analog operation unit 3.

The analog operation unit 3 is formed of, e.g., SW1, SW2, SW3, SW4, Cs (a first capacitor), Cf (a second capacitor), a multiply-by-two amplifier, a COMP1 (a first comparator), and a COMP2 (a second comparator). This analog operation unit 3 has a sample mode and a hold mode described later and switches between the sample mode and the hold mode, thereby producing an output voltage using charge conservation in the capacitors Cs and Cf and then amplifies the output voltage by the multiply-by-two amplifier to produce the amplified voltage as Vout. This Vout is compared with respective predetermined reference voltages (first and second thresholds) in the COMP1 and COMP2, and simultaneously the Vout signal is fed back to the input switching unit 2 to be used at the next stage in the circular-type pipeline AD conversion circuit. Different reference voltages VREFN (the first threshold) and VREFP (the second threshold) are respectively input to the COMP1 and COMP2, which perform comparison operation between the reference voltages and Vout to output "1" or "0".

The digital processing unit 4 receives two-bit digital codes respectively outputted from the COMPs by flip-flops and adds two-bit data outputted at each stage, allowing for carry-bits so as to output digital data.

For the voltage of the reference voltage generating unit 5, charge corresponding to a reference voltage minus Vref/2 is stored in the capacitors Cs and Cf in the hold mode. This reference voltage generating unit 5 will be described later.

The DAC 6 is constituted by, e.g., a DAC having a 1.5-bit redundancy configuration. This DAC 6 selects an input of either −1, 0, or 1 depending on the outputs of the COMP1 and COMP2 and outputs either −Vref/2, 0, or Vref/2.

FIG. 2 is a figure showing the relation between the output of the analog operation unit and the input and output of the DAC.

As shown in FIG. 2, when the COMP1 outputs "1" and the COMP2 outputs "0", the input of "1" to the DAC 6 is selected, and Vref/2 is output from the DAC 6.

When the COMP1 outputs "0" and the COMP2 outputs the input of "0" to the DAC 6 is selected, and "0" is output from the DAC 6.

When the COMP1 outputs "0" and the COMP2 outputs "0", the input of "−1" to the DAC 6 is selected, and −Vref/2 is output from the DAC 6.

Figure 3:
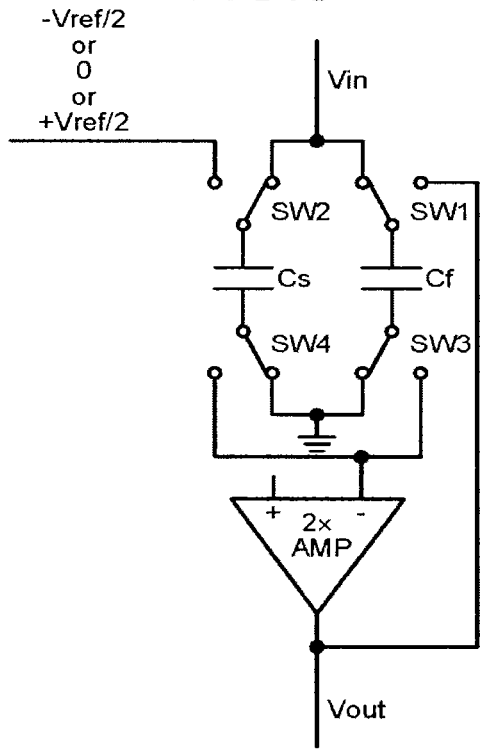
FIG. 3 is a diagram showing the state of the analog operation unit in a sample mode.
Figure 4:
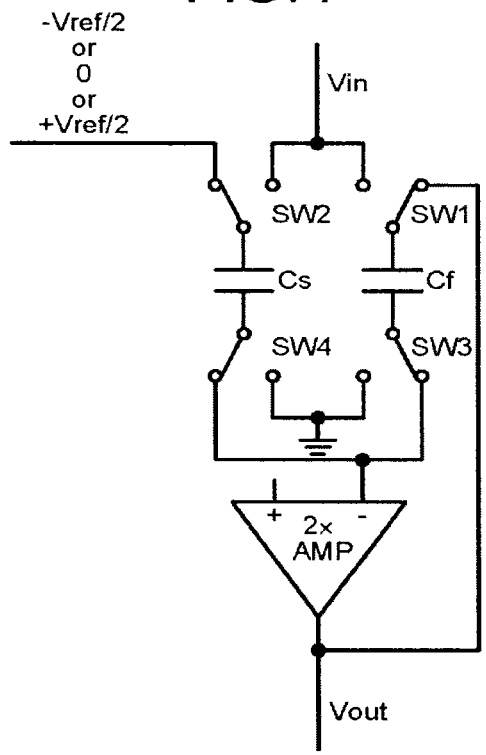
FIG. 4 is a diagram showing the state of the analog operation unit in a hold mode.

FIG. 3 is a diagram showing the state of the analog operation unit in the sample mode, and FIG. 4 is a diagram showing the state of the analog operation unit in the hold mode.

By switching between the sample mode shown in FIG. 3 and the hold mode shown in FIG. 4, the output voltage Vout of the analog operation unit 3, expressed by the following equation (1), is obtained.

$$Vout = 2 \times \left( Vin - \left\{ \begin{array}{c} (Vref/2) \\ \text{or} \\ 0 \\ \text{or} \\ (-Vref/2) \end{array} \right\} \right) \quad (1)$$

As mentioned previously, the pipeline AD conversion circuit 1 according to the first embodiment is constituted by the circular-type pipeline AD conversion circuit. In this circular-type pipeline AD conversion circuit, the analog operation unit switches between the sample mode and the hold mode, thereby producing an output voltage using charge conservation in the capacitors Cs and Cf, and the comparators perform comparison operation on the output voltage Vout produced by amplifying that output voltage by the multiply-by-two amplifier, and then the digital processing unit 4 digitizes the result of the comparison operation to output, and simultaneously the output Vout is fed back to the input. AD conversion is performed by repeating this series of operations a number of times corresponding to the necessary number of bits.

Such a circular-type pipeline AD conversion circuit is a known technique, and the configurations of the analog operation unit 3, the digital processing unit 4, and the DAC 6 are not limited to those shown in FIG. 1 and described above. For example, a 1-bit DAC may be used as the DAC 6, needless to say.

Figure 5:
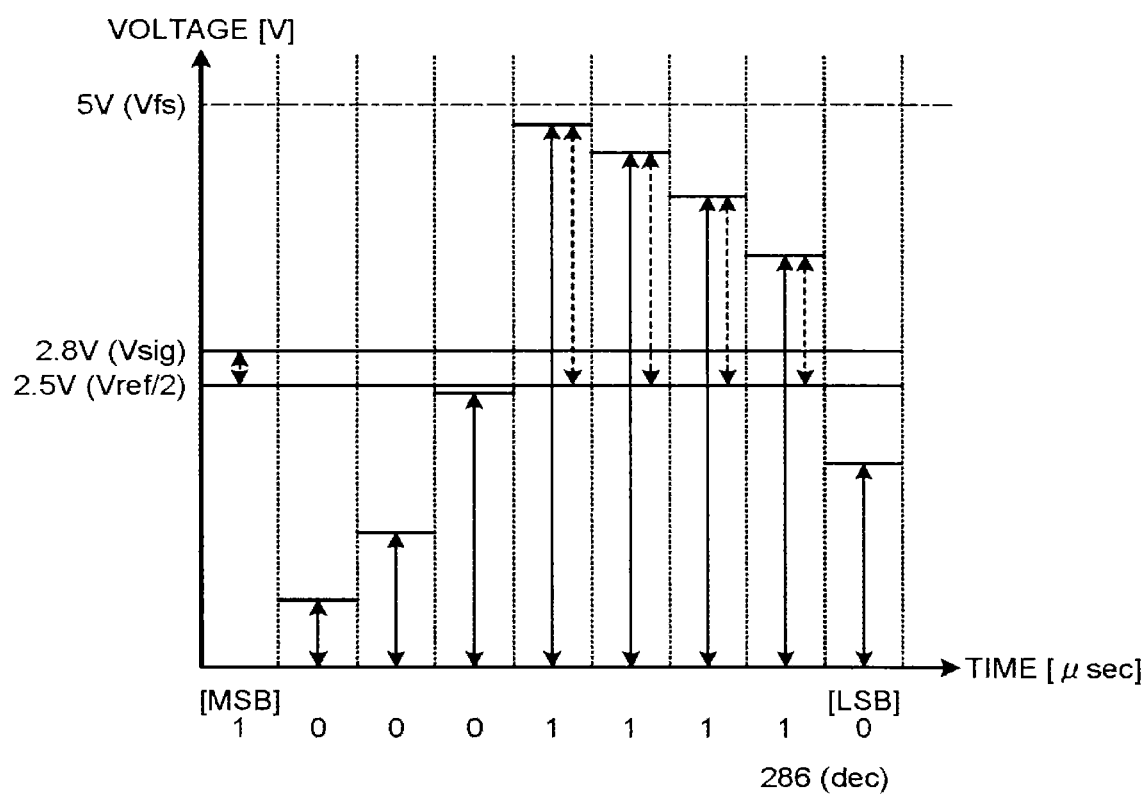
FIG. 5 is a conceptual diagram of the circular-type pipeline AD conversion circuit.

FIG. 5 is a conceptual diagram of the circular-type pipeline AD conversion circuit. In the example shown in FIG. 5, there is shown a conceptual diagram of a circular-type 9-bit pipeline AD conversion circuit where a full scale voltage Vfs=the reference voltage Vref=5.0 V and the input voltage Vsig=(Vin=) 2.8 V.

The circular-type pipeline AD conversion circuit compares the input voltage Vin and the reference voltage Vref/2 and, if Vin>Vref/2, the bit of interest is set to 1, and the residue left by subtracting Vref/2 from Vin is multiplied by two to produce 2(Vin−(Vref/2)), which is inputted in performing an operation for the next bit. If Vin<Vref/2, the bit of interest is set to 0, and Vin is multiplied by two to produce 2Vin, which is inputted in performing an operation for the next bit.

For example, in the example shown in FIG. 5, in the operation of MSB, because 2.8 V (Vin)>2.5 V (Vref/2), MSB becomes "1", and the input Vin in the operation for the bit next to MSB becomes 0.6 V (Vin) that is twice the residue 0.3 V left by subtracting 2.5 V (Vref/2) from 2.8 V (Vin). For example, in the operation for the bit next to MSB, because 0.6 V (Vin)<2.5 V (Vref/2), the bit next to MSB becomes "0", and the input Vin in the operation for the bit next thereto becomes 1.2 V (Vin) that is twice 0.6 V (Vin).

By repeating the above series of operations through LSB, the output value of the AD conversion circuit 1 according to the first embodiment becomes "100011110" in binary notation or "286 (dec)" in decimal notation.

Figure 6:
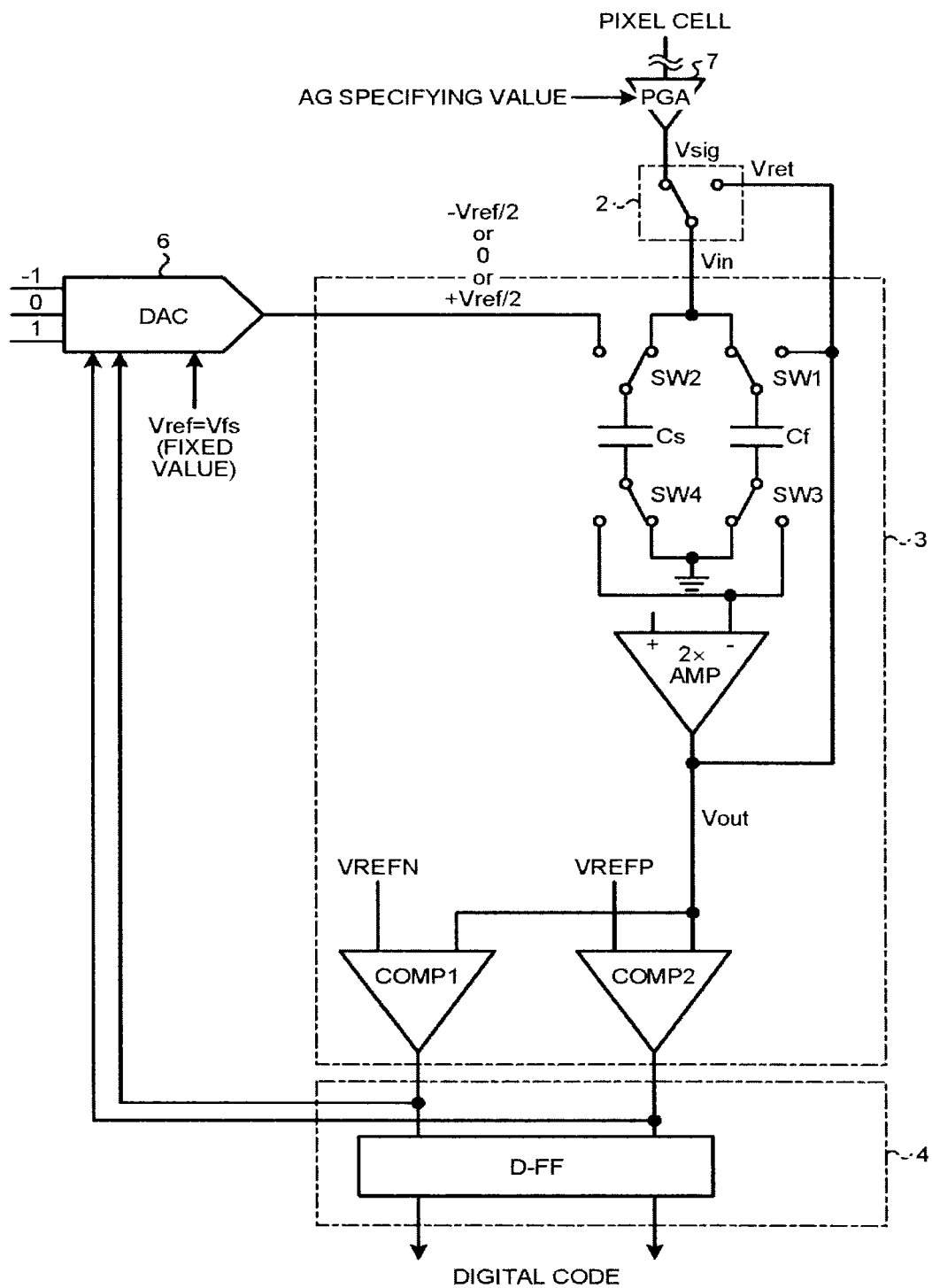
FIG. 6 is a diagram showing a configuration comprising a PGA circuit as a comparative example for the AD conversion circuit according to the first embodiment.
Figure 7:
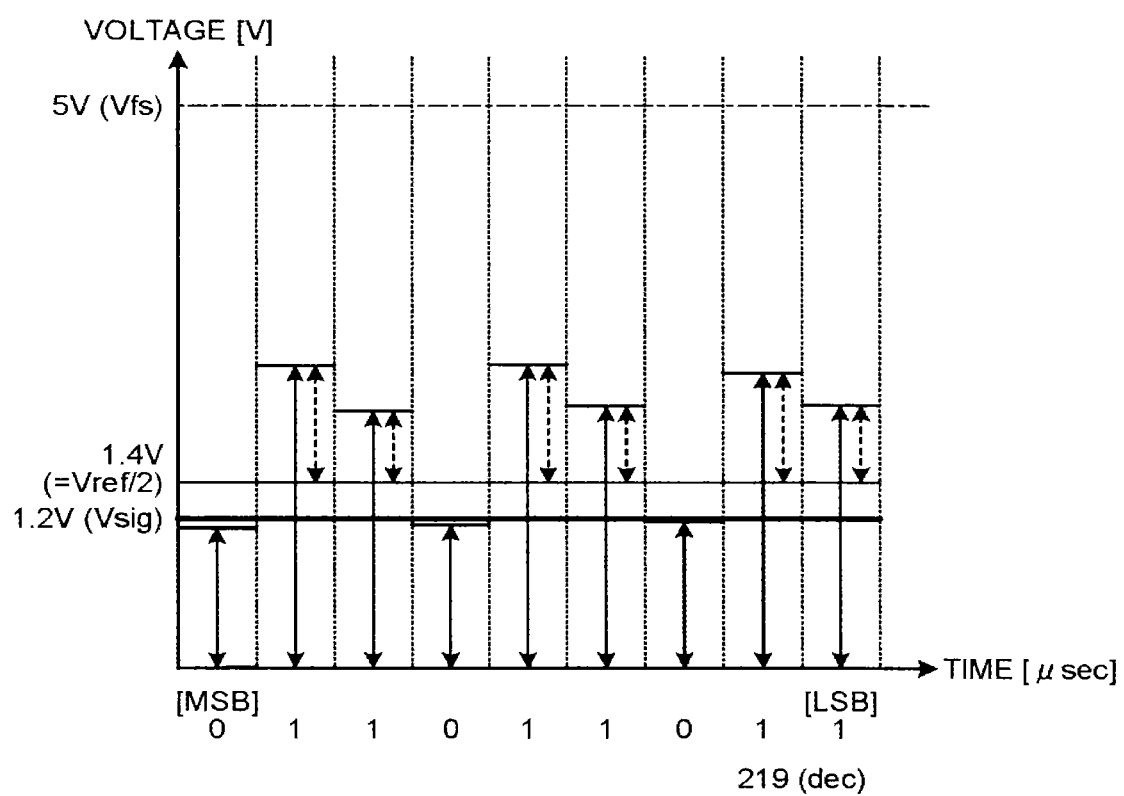
FIG. 7 is a conceptual diagram of the AD conversion circuit according to the first embodiment where, with an input voltage Vsig being 1.2 V, a reference voltage is 1/1.79 times (0.56 times) a full scale voltage.

Next, taking a configuration comprising a PGA circuit as a comparative example for the AD conversion circuit 1 according to the present embodiment, the comparative example and the AD conversion circuit 1 according to the first embodiment will be compared. FIG. 6 is a diagram showing a configuration comprising a PGA circuit as a comparative example for the AD conversion circuit according to the first embodiment. FIG. 7 is a conceptual diagram of the AD conversion circuit according to the first embodiment where, with the input voltage Vsig being 1.2 V, the reference voltage is 1/1.79 times (0.56 times) the full scale voltage.

In the configuration shown in FIG. 6, the reference voltage Vref is set at a fixed value, 5.0 V (=Vfs), instead of the use of the reference voltage generating unit 5 provided for the AD conversion circuit 1 according to the present embodiment, and a PGA circuit 7 is provided. The other part of the configuration is the same as in the AD conversion circuit 1 according to the first embodiment shown in FIG. 1. As in the case shown in FIG. 5, there is shown a circular-type 9-bit pipeline AD conversion circuit where the full scale voltage Vfs=5.0 V, the reference voltage Vref=5.0 V, and the input voltage Vsig=(Vin=) 2.8 V.

In the configuration shown in FIG. 6, in the case where, with the input voltage Vsig being 1.2 V, the reference voltage is 1/1.79 times (0.56 times) the full scale voltage, the output value of the AD conversion circuit shown in FIG. 6 becomes "011011011" in binary notation or "219 (dec)" in decimal notation as shown in FIG. 7.

In the AD conversion circuit 1 according to the present embodiment, the reference voltage generating unit 5 generates the reference voltage Vref that is Vfs multiplied by the inverse of an analog gain specified by an AG specifying value, and thus the same output value can be obtained as in the case where, with the PGA circuit being provided, Vsig is multiplied by the analog gain.

Note that the reference voltage Vref is less than or equal to Vfs and that Vref needs to be set to be in such a range that 2×Vsig (=Vin)−Vref, expressed in Equation (1), does not exceed Vfs. This is because, if this result (=Vout) exceeds Vfs, the operation for the next bit is not correctly performed, resulting in incorrect conversion.

Figure 8:
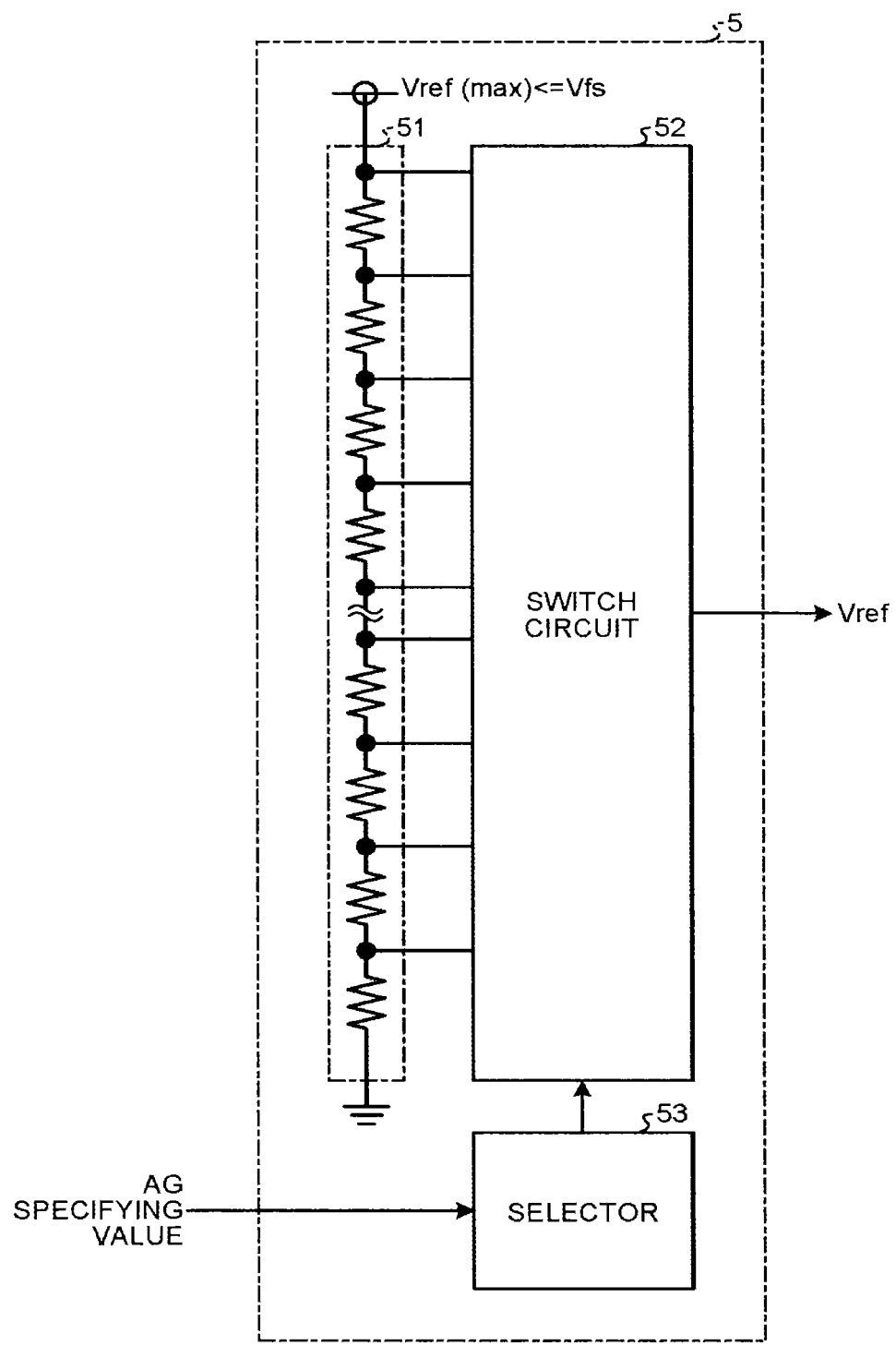
FIG. 8 is a diagram showing the configuration of a reference voltage generating unit according to the first embodiment.

FIG. 8 shows the configuration of the reference voltage generating unit 5 which can prevent Vref>Vfs from holding. FIG. 8 is a diagram showing the configuration of the reference voltage generating unit according to the first embodiment.

As shown in FIG. 8, the reference voltage generating unit 5 is formed of, e.g., a series resistor circuit 51 having multiple resistors connected serially, a switch circuit 52, and a selector 53.

An analog gain specifying value (hereinafter called an AG specifying value) is input from a control means or the like (not shown) to the selector 53, which controls the switch circuit 52 so that the reference voltage Vref according to the AG specifying value is output.

In the present embodiment, a fiducial voltage Vref(max) applied to the series resistor circuit 51 shown in FIG. 8 equals the full scale voltage Vfs. With this configuration, even if the analog gain is 1 or less, Vref>Vfs can be prevented from holding, and thus incorrect conversion can be prevented.

Instead of the series resistor circuit 51 shown in FIG. 8, an R-2R ladder resistor may be used, or a configuration with multiple capacitors instead of the multiple resistors may be used, needless to say.

Figure 9:
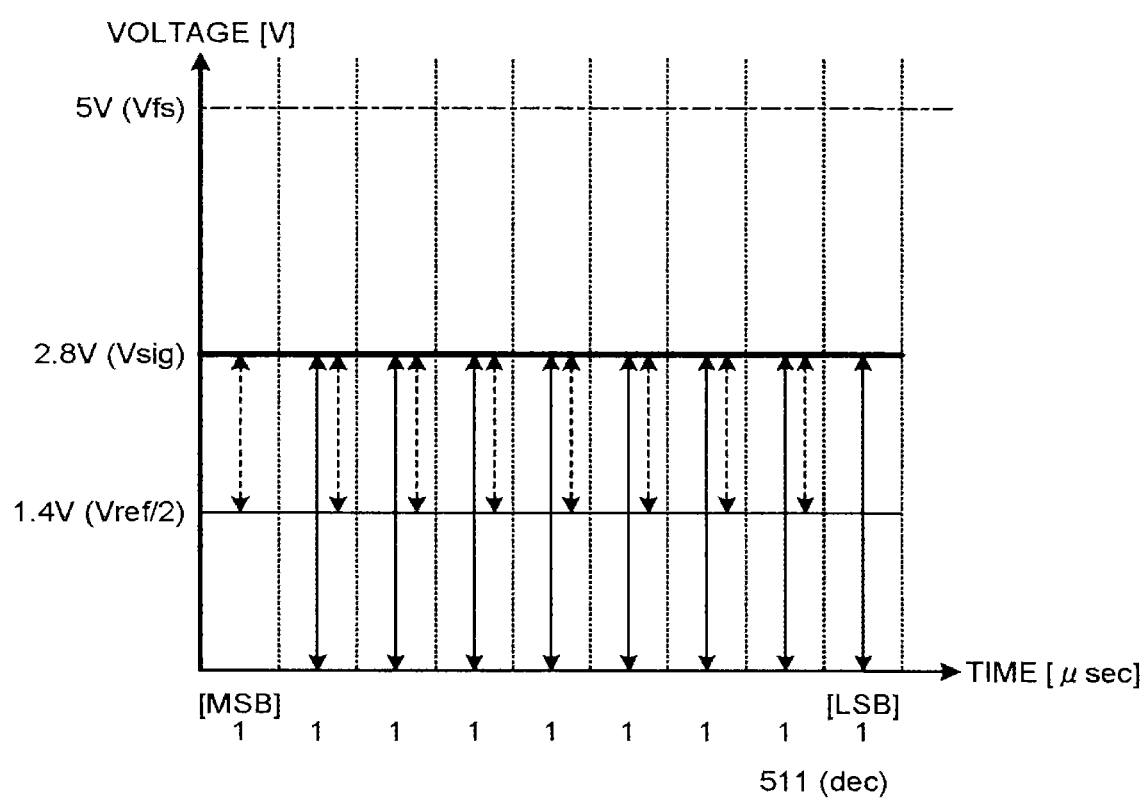
FIG. 9 is a conceptual diagram of the AD conversion circuit according to the first embodiment where, with the input voltage Vsig being 2.8 V, the reference voltage is 1/1.79 times (0.56 times) the full scale voltage.

FIG. 9 is a conceptual diagram of the AD conversion circuit according to the first embodiment where, with the input voltage Vsig being 2.8 V, the reference voltage is 1/1.79 times (0.56 times) the full scale voltage.

In the example shown in FIG. 9, the reference voltage Vref/2 is 1.4 V that is ½ of Vsig (=2.8 V). This case is equivalent to the case where, in the configuration comprising the PGA circuit 7 shown in FIG. 6, the analog gain is 1.79 times, that is, Vsig is 5.0 V, and the output value becomes "111111111" in binary notation or "511 (dec)" in decimal notation. That is, for the range for which Vsig>Vfs holds when multiplied by the analog gain, even if Vfs/2 multiplied by the inverse of the analog gain is used as the reference voltage Vref, the operation result exceeds Vfs, and thus the full bits ("111111111" in binary notation) is output.

FIG. 10 is a figure showing the relation between the analog gain and the reference voltage, and the output values against Vsig in the pipeline AD conversion circuit according to the first embodiment.

As shown in FIG. 10, the control range of the reference voltage Vref by the reference voltage generating unit 5 is less than or equal to Vfs, and Vref needs to be set to be in such a range that 2×Vsig (=Vin)−Vref, expressed in Equation (1), does not exceed Vfs.

Although an example where the invention is applied to a circular-type pipeline AD conversion circuit has been described above, likewise the invention can be applied to a pipeline AD conversion circuit in which an equal number of the configurations shown in FIG. 1 to the number of bits are connected in stages with the outputs of the analog operation unit 3 and the logic operation unit 4 being the inputs of the next stage, needless to say.

According to the first embodiment, the AD conversion circuit has the circular-type or parallel-type pipeline ADC configuration where the input voltage and the reference voltage are compared to perform AD conversion and comprises the reference voltage generating unit that generates the reference voltage so as to change the reference voltage according to the analog gain. As a result, the gain adjustment can be performed without the PGA circuit being provided, and the effect of reducing the cost of realizing a solid-state imaging device can be obtained.

Further, by multiplying the full scale voltage by the inverse of the analog gain, the output value equivalent to that in the case where, with the PGA circuit being provided, its analog gain is adjusted can be obtained.

Yet further, by setting Vref to be in such a range that 2×Vsig (=Vin)−Vref, expressed in Equation (1), does not exceed Vfs, incorrect conversion can be prevented.

Second Embodiment

Figure 11:
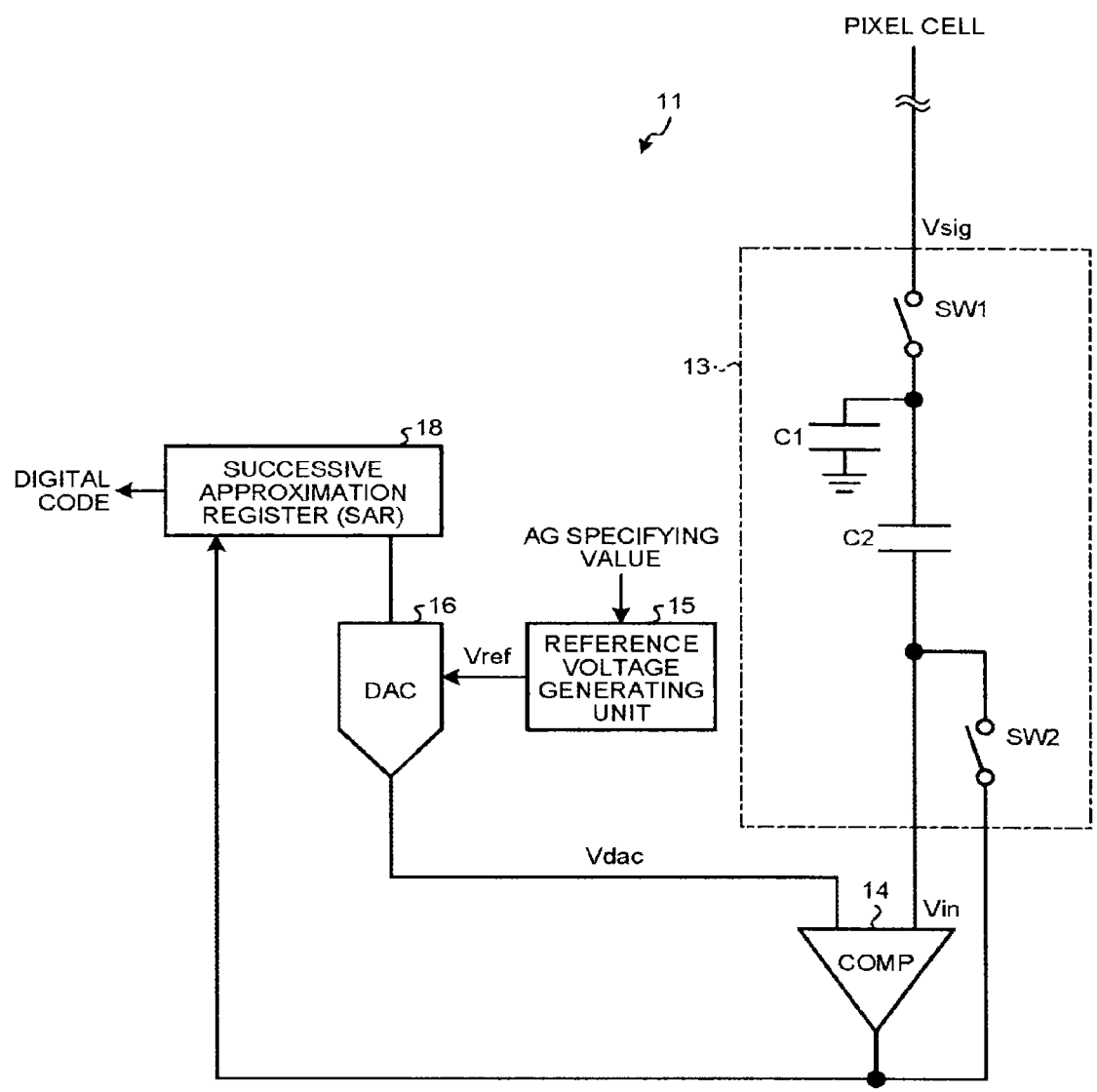
FIG. 11 is a diagram showing the configuration of an AD conversion circuit according to a second embodiment.

FIG. 11 is a diagram showing the configuration of a successive-approximation-type AD conversion circuit according to the second embodiment. Although in the first embodiment an example where the invention is applied to a pipeline-type AD conversion circuit has been described, FIG. 11 shows an example where the invention is applied to a successive-approximation-type AD conversion circuit. Where the AD conversion circuit 11 according to the second embodiment is applied to a CMOS sensor, a correlated double sampling (CDS) scheme may be adopted as in the pipeline-type AD conversion circuit described in the first embodiment. In this case, an S/H (Sample and Hold) circuit is provided at the front stage of the AD conversion circuit, but herein the S/H circuit is omitted from the figure.

The successive-approximation-type AD conversion circuit 11 according to the second embodiment comprises an input voltage hold unit 13, a comparator 14, a reference voltage generating unit 15, a DAC 16, and a successive approximation register (SAR) 18.

The input voltage hold unit 13 is formed of, e.g., SW1, SW2, C1, and C2. In this input voltage hold unit 13, by controlling SW1 and SW2, charge is stored in C1 and C2, and voltage Vsig from a pixel cell is held as an input voltage Vin of the comparator 14.

The comparator 14 compares the input voltage Vin and the output voltage Vdac of the DAC 16 and outputs the comparing result to the SAR 18.

The SAR 18 controls the DAC 16 according to the comparing result of the comparator 14.

The reference voltage generating unit 15 generates the reference voltage Vref to be given to the DAC 16. The reference voltage generating unit 15 will be described later.

Figure 12:
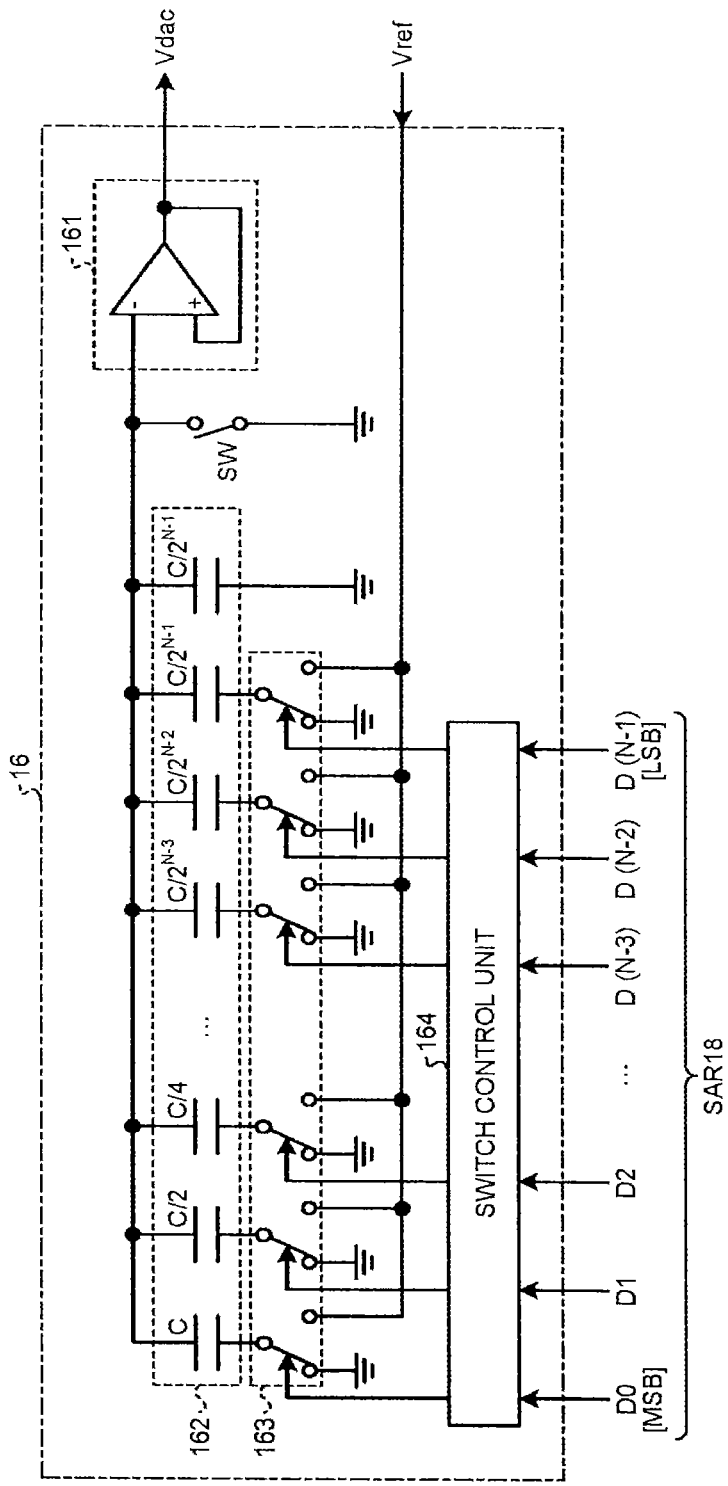
FIG. 12 is a diagram showing the configuration of the DAC of the AD conversion circuit according to the second embodiment.

FIG. 12 is a diagram showing the configuration of the DAC of the AD conversion circuit according to the second embodiment. The DAC 16 is constituted by a capacitor-array-type DAC formed of, e.g., a voltage follower 161, a capacitor set 162, a switch set 163, and a switch control unit 164. In this DAC 16, the switch control unit 164 controls the switch set 163 according to an N-bit digital code (D0, D1, D2, . . . , D(N−3), D(N−2), D(N−1)) input from the SAR 18 to output Vdac expressed by the following equation (2).

$$V\text{dac} = \{C\text{set}/(C\text{set}+Cb)\} \times V\text{ref} = \{C\text{set}/(2C)\} \times V\text{ref} \qquad (2)$$

In the equation (2), Cset is the combined capacitance of the capacitors connected to Vref, and Cb is the combined capacitance of the capacitors connected to GND.

The successive-approximation-type AD conversion circuit 11 according to the second embodiment is a known technique, and the configurations of the input voltage hold unit 13 and the DAC 16 are not limited to those shown in FIGS. 11 and 12 and described above. For example, a binary-weighted DAC using a resistor array or an R-2R ladder resistor DAC may be used as the DAC 16, needless to say.

Figure 13:
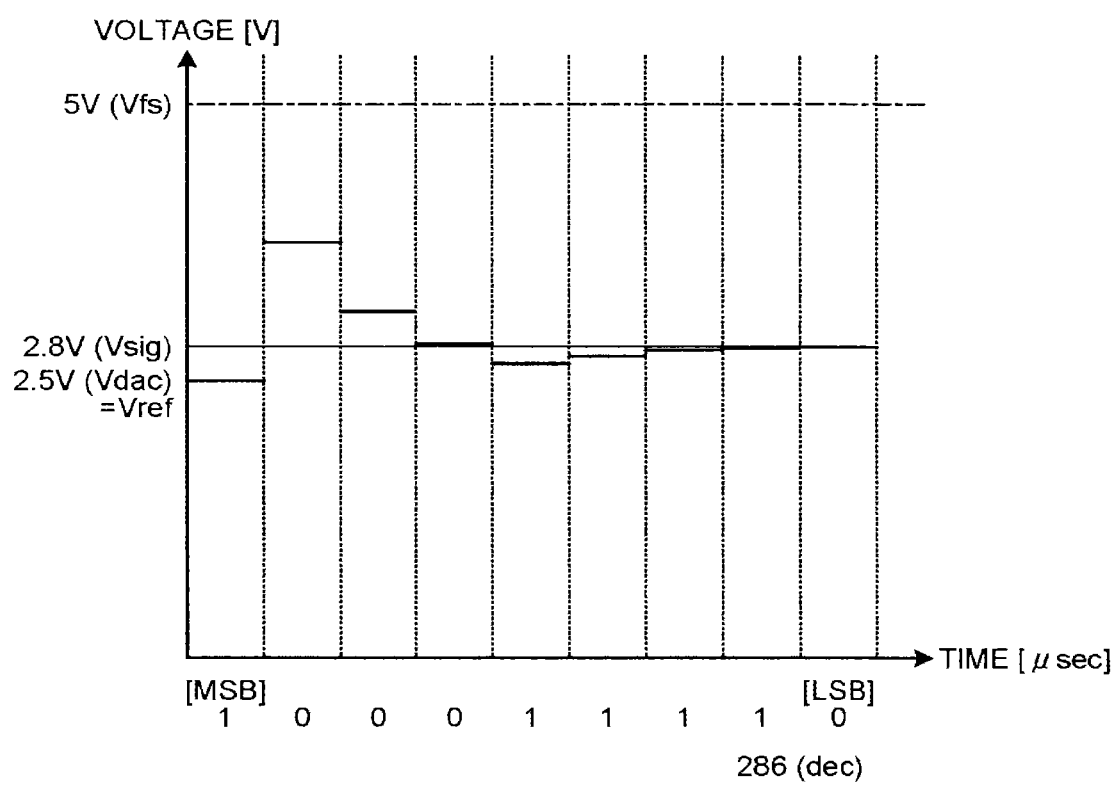
FIG. 13 is a conceptual diagram of the successive-approximation-type AD conversion circuit.

FIG. 13 is a conceptual diagram of the successive-approximation-type AD conversion circuit. In the example shown in FIG. 13, there is shown a conceptual diagram of the operation of a successive-approximation-type 9-bit AD conversion circuit where the full scale voltage Vfs=5.0 V, the reference voltage Vref=2.5 V and the input voltage Vsig=(Vin=) 2.8 V.

In the successive-approximation-type AD conversion circuit, Vdac=½ of Vref is output, and the input voltage Vin and Vdac are compared. At this time, if Vin>Vdac, the MSB bit is set to 1 while Vdac=Vref/2+Vref/4 is output. If Vin<Vdac, the MSB bit is set to 0 while Vdac=Vref/2−Vref/4 is output. Then the input voltage Vin and Vdac are compared, and, if Vin>Vdac, the bit next to MSB is set to 1 while, if the two most significant bits are "11", Vdac=Vref/2+Vref/4 Vref/8 is output or, if the two most significant bits is "01", Vdac=Vref/2−Vref/4+Vref/8 is output. Or, if Vin<Vdac, the bit next to MSB is set to 0 while, if the two most significant bits are "10", Vdac=Vref/2+Vref/4−Vref/8 is output or, if the two most significant bits is "00", Vdac Vref/2−Vref/4−Vref/8 is output. Subsequent to this, by repeating the above series of operations until the LSB bit is output, AD conversion is performed.

For example, in the example shown in FIG. 13, in the operation for MSB, because 2.8 V (Vin)>2.5 V (Vdac), MSB becomes "1", and Vdac in the operation for the bit next to MSB becomes 2.5 V (Vref) plus 1.25 V (Vref/2) that is 3.75 V. For example, in the operation for the bit next to MSB, because 2.8 V (Vin)<3.75 V (Vdac), the bit next to MSB becomes "0", and Vdac in the operation for the bit next thereto becomes 3.75 V (Vref) minus 0.625 V (Vref/4) that is 3.125 V.

By repeating the above series of operations through LSB, the output value of the AD conversion circuit 11 according to the second embodiment becomes "100011110" in binary notation or "286 (dec)" in decimal notation. The output value of the second embodiment coincides with the output value of the circular-type pipeline AD conversion circuit (see FIG. 5).

Figure 14:
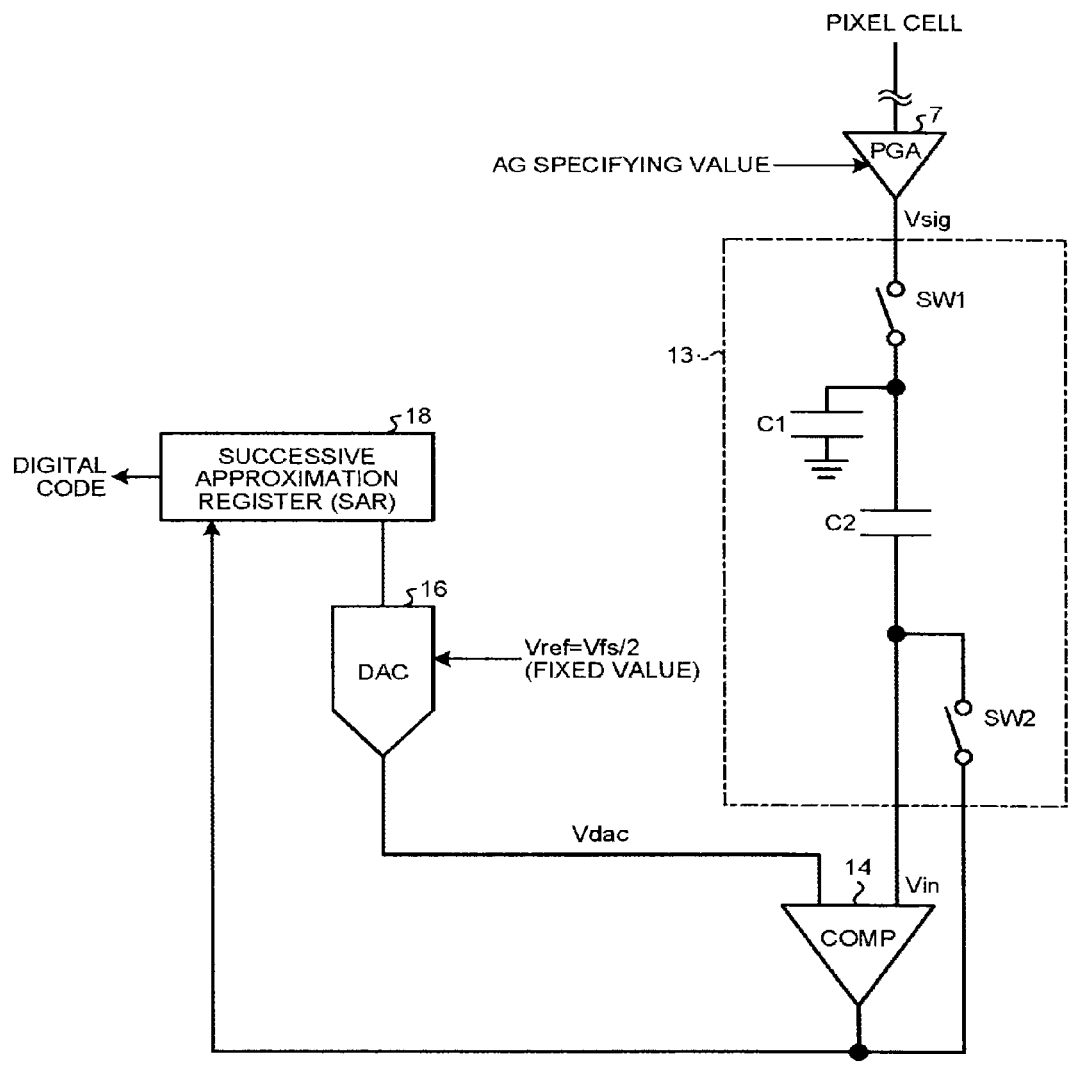
FIG. 14 is a diagram showing a configuration comprising a PGA circuit as a comparative example for the AD conversion circuit according to the second embodiment.
Figure 15:
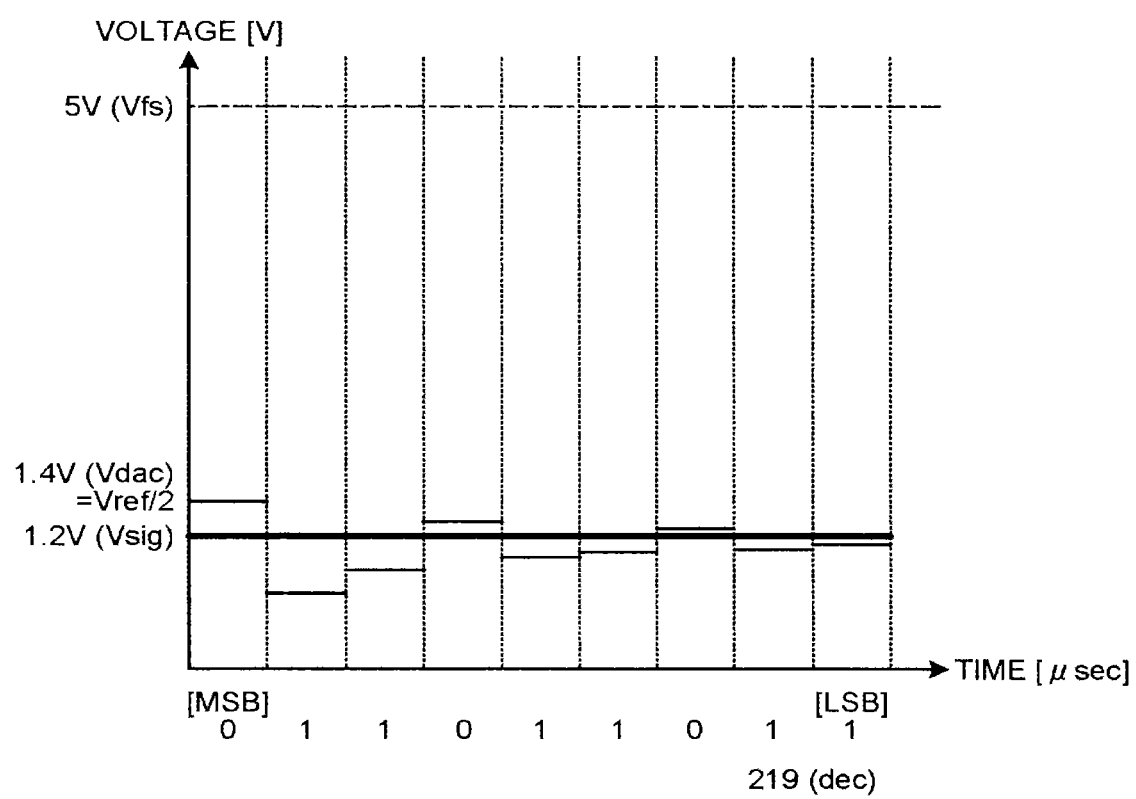
FIG. 15 is a conceptual diagram of the AD conversion circuit according to the second embodiment where, with the input voltage Vsig being 1.2 V, the reference voltage is 1/1.79 times (0.56 times) ½ of the full scale voltage.

Next, taking a configuration comprising a PGA circuit as a comparative example for the AD conversion circuit 11 according to the present embodiment, the comparative example and the AD conversion circuit 11 according to the second embodiment will be compared. FIG. 14 is a diagram showing a configuration comprising a PGA circuit as a comparative example for the AD conversion circuit according to the second embodiment. FIG. 15 is a conceptual diagram where, with the input voltage Vsig being 1.2 V, the reference voltage is 1/1.79 times (0.56 times) ½ of the full scale voltage.

In the configuration shown in FIG. 14, the reference voltage Vref is set at a fixed value, Vfs/2, instead of the use of the reference voltage generating unit 15 provided for the AD conversion circuit 11 according to the present embodiment, and a PGA circuit 7 is provided. The other part of the configuration is the same as in the AD conversion circuit 11 according to the second embodiment shown in FIG. 11. As in the case shown in FIG. 11, there is shown a successive-approximation-type 9-bit AD conversion circuit where the full scale voltage Vfs=5.0 V, the reference voltage Vref=2.5 V, and the input voltage Vsig=(Vin=) 2.8 V.

In the configuration shown in FIG. 14, in the case where, with the input voltage Vsig being 1.2 V, the reference voltage is 1/1.79 times (0.56 times) ½ of the full scale voltage, the output value of the AD conversion circuit shown in FIG. 14 becomes "011011011" in binary notation or "219 (dec)" in decimal notation as shown in FIG. 15.

In the AD conversion circuit 11 according to the present embodiment, the reference voltage generating unit 15 generates the reference voltage Vref that is Vfs multiplied by the inverse of an analog gain specified by an AG specifying value, and thus the same output value can be obtained as in the case where, with the PGA circuit being provided, Vsig is multiplied by the analog gain.

Note that the reference voltage Vref is less than or equal to ½ of Vfs. This is because, if Vref>Vfs/2, an operation value may become greater than Vfs during AD conversion, so that, in this case, the operation for the next bit is not correctly performed, resulting in incorrect conversion.

Figure 16:
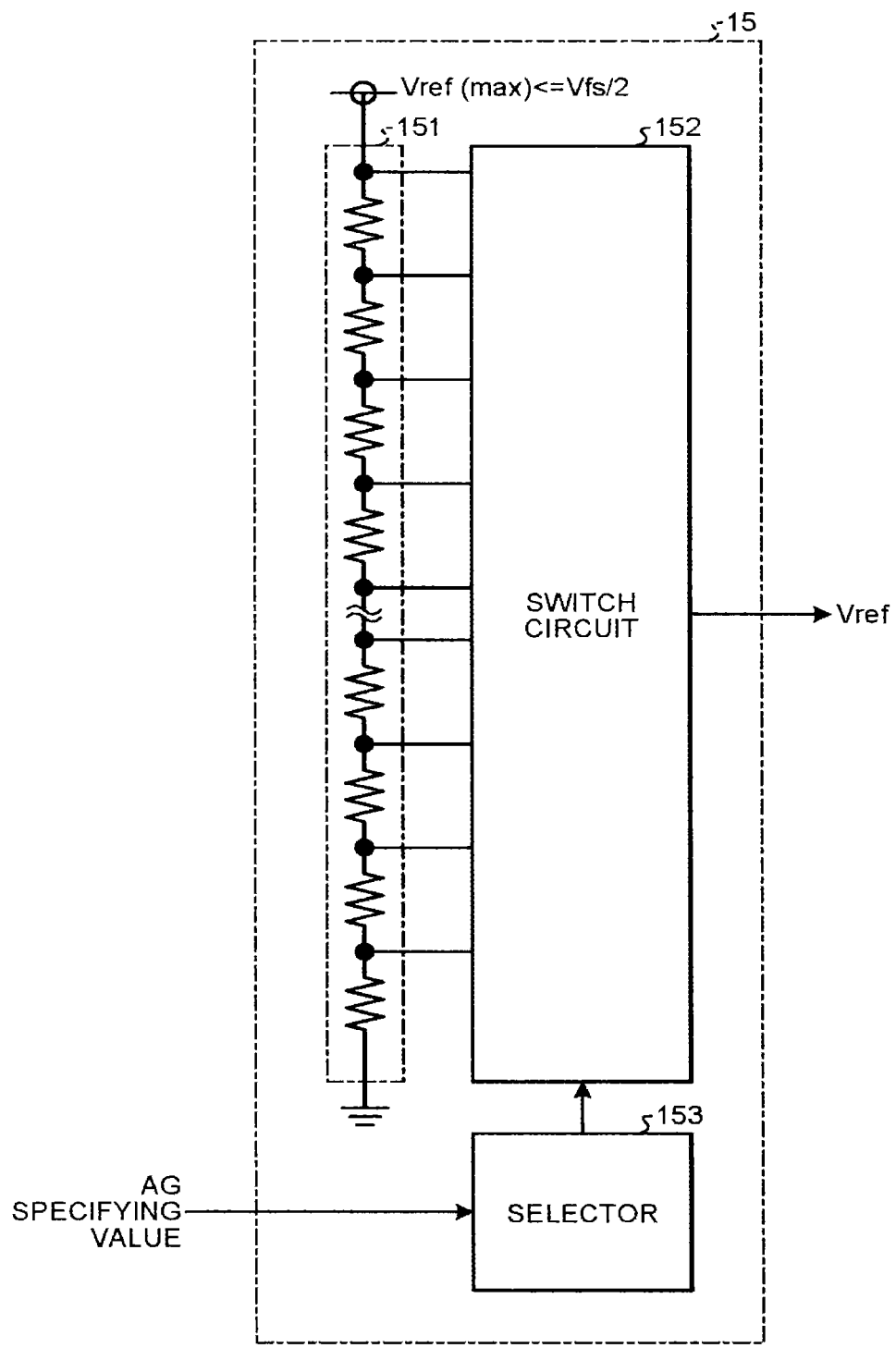
FIG. 16 is a diagram showing the configuration the reference voltage generating unit according to the second embodiment.

FIG. 16 shows the configuration of the reference voltage generating unit 15 which can prevent Vref>Vfs/2 from holding. FIG. 16 is a diagram showing the configuration of the reference voltage generating unit according to the second embodiment.

As shown in FIG. 16, the reference voltage generating unit 15 is formed of, e.g., a series resistor circuit. 151 having multiple resistors connected serially, a switch circuit. 152, and a selector 153 as is the reference voltage generating unit 5 described in the first embodiment.

An AG specifying value is input from a control means or the like (not shown) to the selector 153, which controls the switch circuit 152 so that the reference voltage Vref according to the AG specifying value is output, as in the first embodiment.

In the present embodiment, a fiducial voltage Vref(max) applied to the series resistor circuit 151 shown in FIG. 16 equals ½ of the full scale voltage Vfs (=Vref(max)). With this configuration, even if the analog gain is 1 or less, Vref>Vfs/2 can be prevented from holding, and thus incorrect conversion can be prevented.

As in the first embodiment, instead of the series resistor circuit 151 shown in FIG. 16, an R-2R ladder resistor may be used, or a configuration with multiple capacitors instead of the multiple resistors may be used, needless to say.

Figure 17:
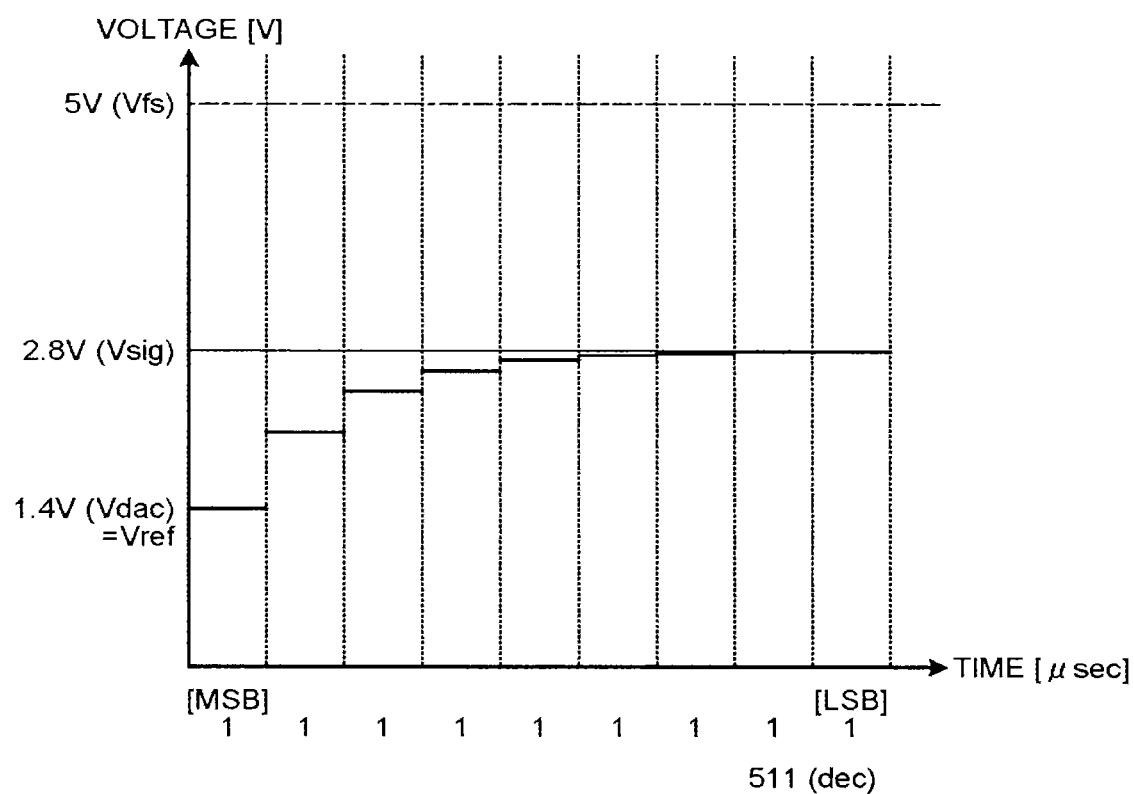
FIG. 17 is a conceptual diagram of the AD conversion circuit according to the second embodiment where, with the input voltage Vsig being 2.8 V, the reference voltage is 1/1.79 times (0.56 times) ½ of the full scale voltage.

FIG. 17 is a conceptual diagram of the AD conversion circuit according to the second embodiment where, with the input voltage Vsig being 2.8 V, the reference voltage is 1/1.79 times (0.56 times) ½ of the full scale voltage.

In the example shown in FIG. 17, the initial value of Vdac, i.e., Vref is 1.4 V that is ½ of Vsig (=2.8 V). This case is equivalent to the case where, in the configuration comprising the PGA circuit 7 shown in FIG. 15, the analog gain is 1.79 times, that is, Vsig is 5.0 V, and the output value becomes "111111111" in binary notation or "511 (dec)" in decimal notation. That is, for the range for which Vsig>Vfs holds when multiplied by the analog gain, even if Vfs multiplied by the inverse of the analog gain is used as the reference voltage Vref, the operation result exceeds Vfs, and thus the full bits ("111111111" in binary notation) is output.

FIG. 18 is a figure showing the relation between the analog gain and the reference voltage, and the output values against Vsig in the AD conversion circuit according to the second embodiment.

As shown in FIG. 18, the control range of the reference voltage Vref by the reference voltage generating unit 15 is expressed as Vref Vfs/2.

According to the second embodiment, the AD conversion circuit having the successive-approximation-type configuration and comparing the input voltage and the reference voltage to perform AD conversion, comprises the reference voltage generating unit that generates the reference voltage so as to change the reference voltage according to the analog gain. As a result, the gain adjustment can be performed without the PGA circuit being provided, and the effect of reducing the cost of realizing a solid-state imaging device can be obtained.

Further, by multiplying the full scale voltage Vfs by the inverse of the analog gain, the output value equivalent to that in the case where, with the PGA circuit being provided, its analog gain is adjusted can be obtained.

Yet further, by setting Vref Vfs/2 as the control range of the reference voltage Vref, incorrect conversion can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An AD conversion circuit of a pipeline type or successive-approximation type which compares an input voltage and a reference voltage to perform AD conversion, comprising:
   a reference voltage generating unit that generates the reference voltage, the reference voltage generating unit changing the reference voltage according to an analog gain of an output value against the input voltage,
   the reference voltage generating unit taking a value obtained by multiplying a fiducial voltage by the inverse of the analog gain as the reference voltage.

2. The AD conversion circuit according to claim 1, wherein the AD conversion circuit has a configuration of the pipeline type, and
   wherein the reference voltage generating unit sets the fiducial voltage to be less than or equal to a full scale voltage in AD conversion and in such a range that the reference voltage subtracted from twice the input voltage does not exceed the full scale voltage.

3. The AD conversion circuit according to claim 2, wherein the analog gain of one times is defined to mean that the fiducial voltage is the same as the full scale voltage in AD conversion.

4. The AD conversion circuit according to claim 2, wherein the reference voltage generating unit comprises:
   a series resistor circuit formed of multiple resistors and outputting a divided voltage whose maximum value equals the full scale voltage;
   a switch circuit that switches the divided voltage output from the series resistor circuit; and
   a selector that controls the switch circuit according to the analog gain.

5. The AD conversion circuit according to claim 2, comprising:
   an analog operation unit that outputs a result of comparison operation between the input voltage and the reference voltage;
   a DAC that performs DA conversion based on the comparison operation result to output the reference voltage to the analog operation unit; and
   a digital processing unit that digitizes the comparison operation results into a predetermined number of bits of digital data to output.

6. The AD conversion circuit according to claim 5, wherein the analog operation unit has a sample mode and a hold mode and comprises:
   a multiply-by-two amplifier that switches between the sample mode and the hold mode and amplifies a voltage obtained in the hold mode twofold; and
   a comparator that outputs a result of comparing the output voltage of the multiply-by-two amplifier and a predetermined threshold as the comparison operation result.

7. The AD conversion circuit according to claim 6, wherein the analog operation unit has first and second capacitors wherein, in the sample mode, the capacitors are connected in parallel, so that the input voltage is applied to them to store charge and wherein, in the hold mode, the first capacitor is connected between the DAC and the multiply-by-two amplifier while the second capacitor is connected between the input and output of the multiply-by-two amplifier, and
   wherein the input voltage of the multiply-by-two amplifier is determined by charge conservation of the capacitance of the first capacitor and the capacitance of the second capacitor.

8. The AD conversion circuit according to claim 6, wherein the DAC has a 1.5-bit redundancy configuration, and the threshold includes a first threshold and a second threshold different from the first threshold,
   wherein the comparator includes a first comparator that compares the output voltage of the multiply-by-two amplifier and the first threshold and a second comparator that compares the output voltage of the multiply-by-two amplifier and the second threshold, and
   wherein the DAC selects one of ½ of the reference voltage, 0, and −½ of the reference voltage depending on the output logical value of the first comparator and the output logical value of the second comparator to output.

9. The AD conversion circuit according to claim 6, further comprising:
   an input switching unit that switches between an external voltage signal and the output voltage of the multiply-by-two amplifier to output as the input voltage to the analog operation unit,
   wherein the input switching unit selects the external voltage signal when obtaining MSB of the digital data and selects the output voltage of the multiply-by-two amplifier when obtaining the bit next to the MSB through LSB.

10. The AD conversion circuit according to claim 1, wherein the AD conversion circuit has a configuration of the successive-approximation type, and
    wherein the reference voltage generating unit sets the fiducial voltage to be less than or equal to ½ of a full scale voltage in AD conversion.

11. The AD conversion circuit according to claim 10, wherein the analog gain of one times is defined to mean that the fiducial voltage equals ½ of the full scale voltage in AD conversion.

12. The AD conversion circuit according to claim 10, wherein the reference voltage generating unit comprises:
    a series resistor circuit formed of multiple resistors and outputting a divided voltage whose maximum value equals ½ of the full scale voltage;
    a switch circuit that switches the divided voltage output from the series resistor circuit; and
    a selector that controls the switch circuit according to the analog gain.

13. The AD conversion circuit according to claim 10, comprising:
    a comparator that outputs a result of comparison operation between the input voltage and a voltage value generated based on the reference voltage;
    a successive approximation register that sequentially stores the comparison operation results and digitizes the comparison operation results into a predetermined number of bits of digital data to output; and a DAC that generates the voltage value to be compared with the input voltage in the comparator from the comparison operation result stored in the successive approximation register and the reference voltage to output.

14. The AD conversion circuit according to claim 13, wherein the DAC is constituted by a capacitor-array-type DAC comprising:
   a capacitor set formed of multiple capacitors having one ends connected in common;
   a switch set formed of multiple switches that can switch the other ends of the multiple capacitors between being grounded and the reference voltage being input to; and
   a switch control unit that controls the switch set according to the comparison operation results stored in the successive approximation register.

15. The AD conversion circuit according to claim 13, wherein the DAC is a binary-weighted DAC using a resistor array.

16. The AD conversion circuit according to claim 13, wherein the DAC is an R-2R ladder resistor DAC.

17. The AD conversion circuit according to claim 13, further comprising an input voltage hold unit that holds an external voltage signal as the input voltage while the successive approximation register sequentially stores MSB through LSB of the digital data.

* * * * *